United States Patent [19]
Fuenfgelder et al.

[11] Patent Number: 4,723,306
[45] Date of Patent: Feb. 2, 1988

[54] WIDE-BAND TRANSMITTER FOR SHORT ELECTROMAGNETIC WAVES

[75] Inventors: Helmut Fuenfgelder, Uffenheim; Dieter Ochsmann, Holzkirchen; Johann-Gerhard Zirwas, Groebenzell, all of Fed. Rep. of Germany

[73] Assignee: Siemens Aktiengesellschaft, Berlin and Munich, Fed. Rep. of Germany

[21] Appl. No.: 865,629

[22] Filed: May 22, 1986

[30] Foreign Application Priority Data

Jun. 25, 1985 [DE] Fed. Rep. of Germany ....... 3522712

[51] Int. Cl.$^4$ .............................................. H04B 1/04
[52] U.S. Cl. ................................... 455/103; 455/114; 455/125
[58] Field of Search .................. 455/91, 103, 114, 120, 455/125

[56] References Cited

U.S. PATENT DOCUMENTS 3,546,590 12/1970 Covill ................................... 455/114
4,234,965 11/1980 Bickley et al. ...................... 455/120
4,521,913 6/1985 Huber et al. ......................... 455/125

FOREIGN PATENT DOCUMENTS 3203961 8/1983 Fed. Rep. of Germany .
3310389 10/1984 Fed. Rep. of Germany .

OTHER PUBLICATIONS

"Wideband Linear Amplifiers in h.f. Communications" by Ling, Electronics Components and Applications, vol. 3, #4, 8/1981.

Primary Examiner—Jin F. Ng
Attorney, Agent, or Firm—Hill, Van Santen, Steadman & Simpson

[57] ABSTRACT

A wide band, transistorized power transmitter for the execution of radio traffic requires a filter arrangement consisting of a large number of sub-filters because of the insufficient linearity of the transmitter end stage between the output of the transmitter end stage and the transmitter output. Depending upon the adjusted transmitter frequency, in order to suppress undesired harmonics, one of the sub-filters is switched into the signal path. The relays normally used to switch on and off the sub-filter are unsuitable for carryout out frequency jump operation. By effecting a suitable sub-division of the sub-filters of the filter arrangement into two and more sub-filter groups, between which it is possible to carry out a rapid and non-abrasive switch-over by way of electronic power switches, it is possible without too high an expense to carry out a frequency jump interval which can be arbitrarily adjusted within the overall frequency range.

11 Claims, 4 Drawing Figures

WIDE-BAND TRANSMITTER FOR SHORT ELECTROMAGNETIC WAVES

BACKGROUND OF THE INVENTION

1. Field of the Invention

The present invention relates to a transmitter which can be tuned over a wide frequency band, in particular a short-wave transmitter, with a filter arrangement which is connected between the output of the transmitter end stage and the transmitter output, in which the filter arrangement comprises sub-filters which are assigned to specific sub-frequency ranges of the transmitter operating frequency and which, in order to suppress undesired harmonics of the transmitter operating frequencies, can be alternatively switched into the signal path of the input end and the output end, via relays, in dependence upon the transmitter operating frequency.

2. Description of the Prior Art

Transmitter devices of the above type are generally known, for example, from the publication "Electronic Components and Applications", Vol. 3, No. 4, Aug. 1981, pp. 210–223 and through the German application No. 33 10 389 Al. Normally in a variable transmitter a filter arrangement consisting of eight sub-octave filters is used for the short-wave band between 1.5 MHz and 30 MHz. Because of the high transmitting power in the order of 1 KW, relays are used to connect the sub-octave filters in dependence upon the transmitter operating frequency because they are moderately priced and suitable for higher switching paths. However, such relays are unsuitable when, as is being increasingly requested by the user, a rapid frequency change is to be carried out, such as is the case, in particular, when a frequency jump procedure is used in order to increase the resistance to interference of a radio connection.

It is, in fact, fundamentally possible to replace the relays by electronic power switches which can carry out a wear-free, rapid switching sequence. However, because of the high switching currents which are required, electronic power switches of this kind involve a considerable technical expense which is of particular significance when several such electronic power switches, namely two power switches, are required in respect of each sub-octave filter.

SUMMARY OF THE INVENTION

The object of the present invention, therefore, is to provide, for a wide-band transmitter of the type set forth above, a method of carrying out a rapid frequency change which involves a minimum of additional technical expense for electronic power switches.

The above object is achieved, according to the present invention, by a method which is particularly characterized that, in order to carry out a rapid frequency jump operation within an arbitrarily-selectable sub-frequency band of the variable frequency band, the sub-filters, in series with the relays with which they are each assigned at the input end and at the output end, are sub-divided into two and more sub-filter groups having terminals connected in parallel at the input end and at the output end, that moreover each sub-filter group can be switched into the signal path at the input end and at the output end via an electronic group switch and that the sub-division of the sub-filters into individual sub-filter groups is carried out in such a manner that, independently of the selected position of the sub-frequency band provided for the frequency jump operation (frequency jump interval), this jump frequency interval always occurs within a sub-frequency range which, if more than one sub-filter must be used for this purpose, is determined exclusively by sub-filters which are assigned to different sub-filter groups.

The invention is based on the recognition that, especially in radio devices, that frequency range which is favorable for radio operation in dependence upon the time of day only represents a smaller sub-range of the overall frequency range covered by the wide-band, variable radio transmitter. Therefore, regardless of the position assumed by this favorable frequency range, which is to be considered as a frequency jump interval, within the overall frequency range to which the transmitter can be tuned, a rapid switch-over between different sub-filter ranges can always be limited to a switch-over between a small number of sub-filters. Therefore, the division, provided in accordance with the present invention, of the filter arrangement into sub-filter groups means that in order to carry out a rapid frequency change only electronic power switches are required for switching over between the different sub-filter groups. Here, the position of the frequency jump interval within the frequency band range to which the transmitter can be tuned is determined by which of the sub-filters of a sub-filter group is switched through via its input-end switching relay and its output-end switching relay to the sub-filter group input and output.

The advantage of this switching concept consists not only in the relatively small number of electronic power switches, but also in the accompanying possibility of modification. Depending upon whether the radio transmitter is to be capable of frequency jump operation or not, the electronic power switches can be used, without modifying the filter arrangement and the basic switching concept, or else they can be dispensed with.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
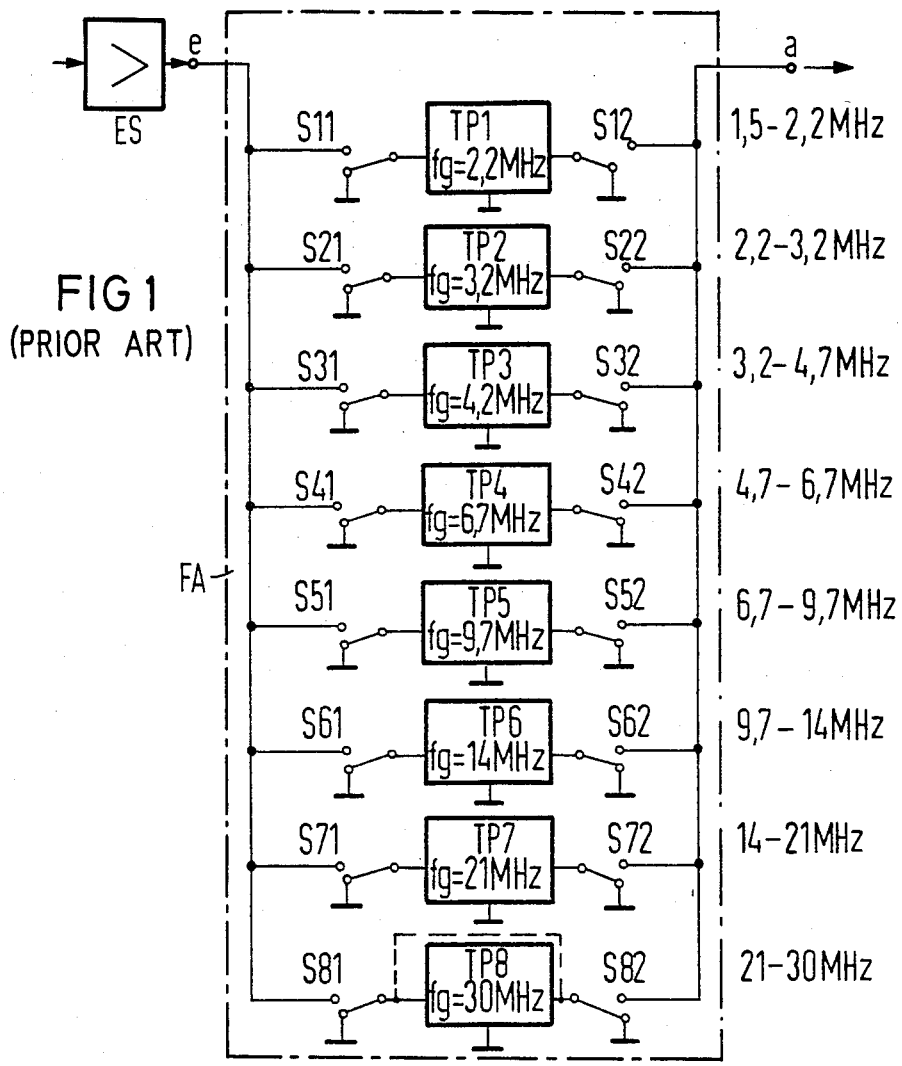
FIG. 1 is a schematic block diagram which represents a conventional filter arrangement between the output of the transmitter end stage and the transmitter output for a short-wave transmitter in the range between 1.5 MHz and 30 MHz.

The conventional filter arrangement FA shown in FIG. 1 includes an input e which is connected to the output of the transmitter end stage ES and an output a which is connected to the transmitter output, the arrangement being designed for a short-wave transmitter in the range between 1.5 MHz and 30 MHz. The filter arrangement FA comprises eight sub-filters TP1, TP2, ... TP8. Advantageously, these are designed as Cauer parameter low-pass filters. The sub-filter TP1 is provided for the frequency range from 1.5 to 2.2 MHz and has a cut-off frequency of fg=2.2 MHz. Similarly, the sub-filter TP2 has a cut-off frequency of 3.2 MHz and is provided for the frequency range from 2.2 to 3.2 MHz, the sub-filter TP3 has a cut-off frequency of 4.2 MHz and is provided for the frequency range from 3.2 to 4.7 MHz and the additional sub-filters TP5, TP6, TP7 and TP8 have cut-off frequencies of 6.7 MHz, 9.7 MHz, 14 MHz, 21 MHz and 30 MHz and are respectively provided for the frequency ranges of 4.7 to 6.7 MHz, 6.7 to 9.7 MHz, 9.7 to 14.7 MHz, 14 to 21 MHz and 21 to 30 MHz.

As can be seen from FIG. 1, by electronically-controlled switches S11, S21, ... S81 and S12, S22, ... S82, which are here in the form of relays, the sub-filters TP1, TP2, ... TP8 can be alternatively switched, at their input and output ends, into the signal path between the output of the transmitter end stage ES and the transmitter output, in dependence upo the transmitter operating frequency.

The relays of the electrically-controllable switches S11, S21 ... S81 and S12, S22, ... S82, arranged at one output end of the sub-filters TP1, TP2, ... TP8, are not only capable of satisfactorily switching high transmitter powers, but also exhibit the necessary crosstalk attenuation. However, they are unsuitable for a frequency jump operation of the transmitter since, because of their mechanically-moving components, they cannot be switched sufficiently rapidly for this purpose and are also subject to very rapid wear.

However, the replacement of all of the relay switches by electronic power switches, which can consist of PIN diodes, also does not represent a suitable solution since, due to the high switching currents, with the large number of power switches of this kind which will be required, the technical expense would become extremely high.

Since, as already described, only a sub-range of the frequency range to which the transmitter can be tuned is at any time suitable for frequency jump operation, as will now be explained in further detail making reference to FIGS. 2 and 3, it is possible to substantially reduce the number of electronic power switches required for frequency jump operation of this kind, while simultaneously using the previously-conventional relay switches.

Figure 2:
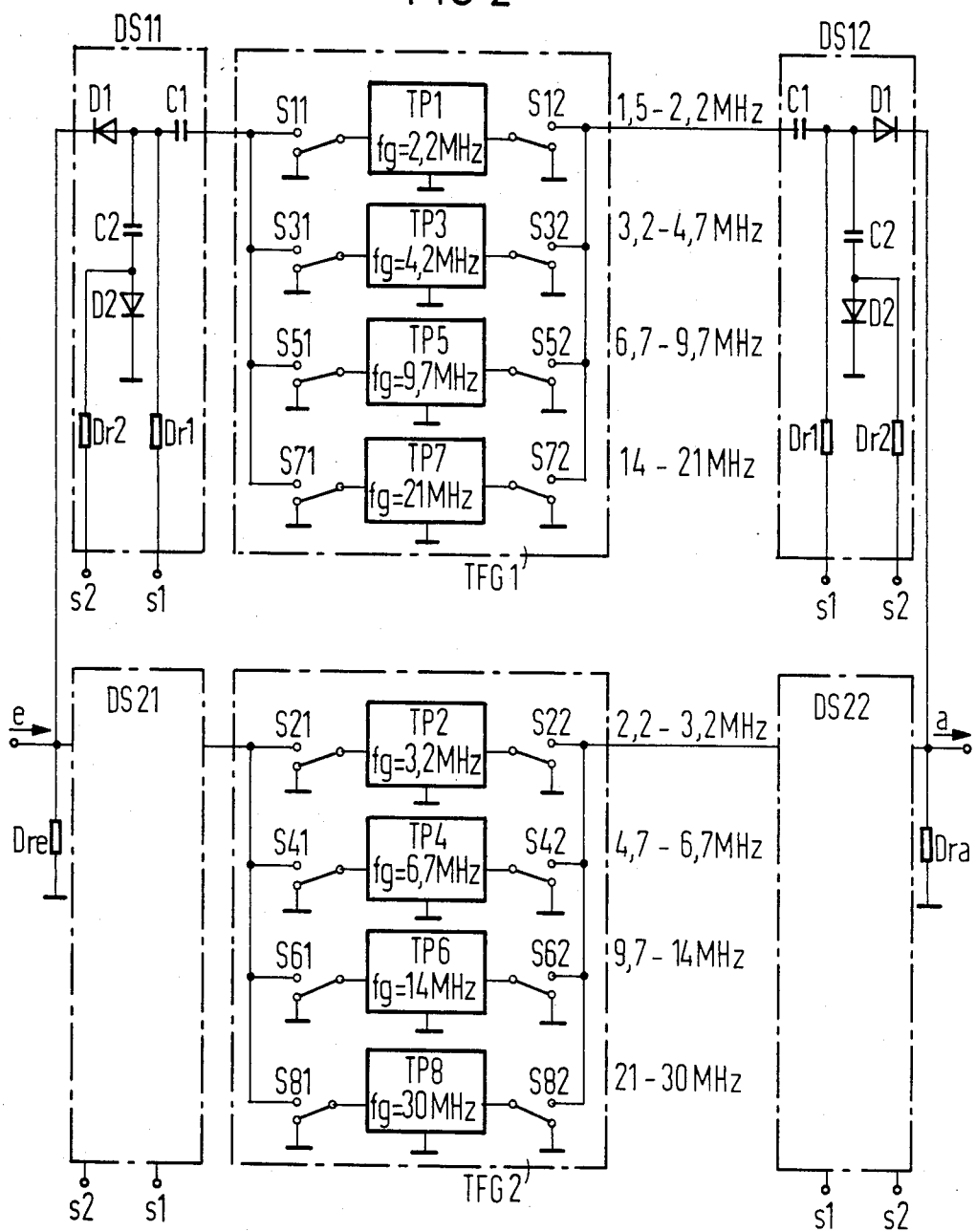
FIG. 2. is a schematic block diagram of the filter arrangement as shown in FIG. 1, but sub-divided into two sub-filter groups, using electronic power switches to effect a switch-over between these two-filter groups.
Figure 3:
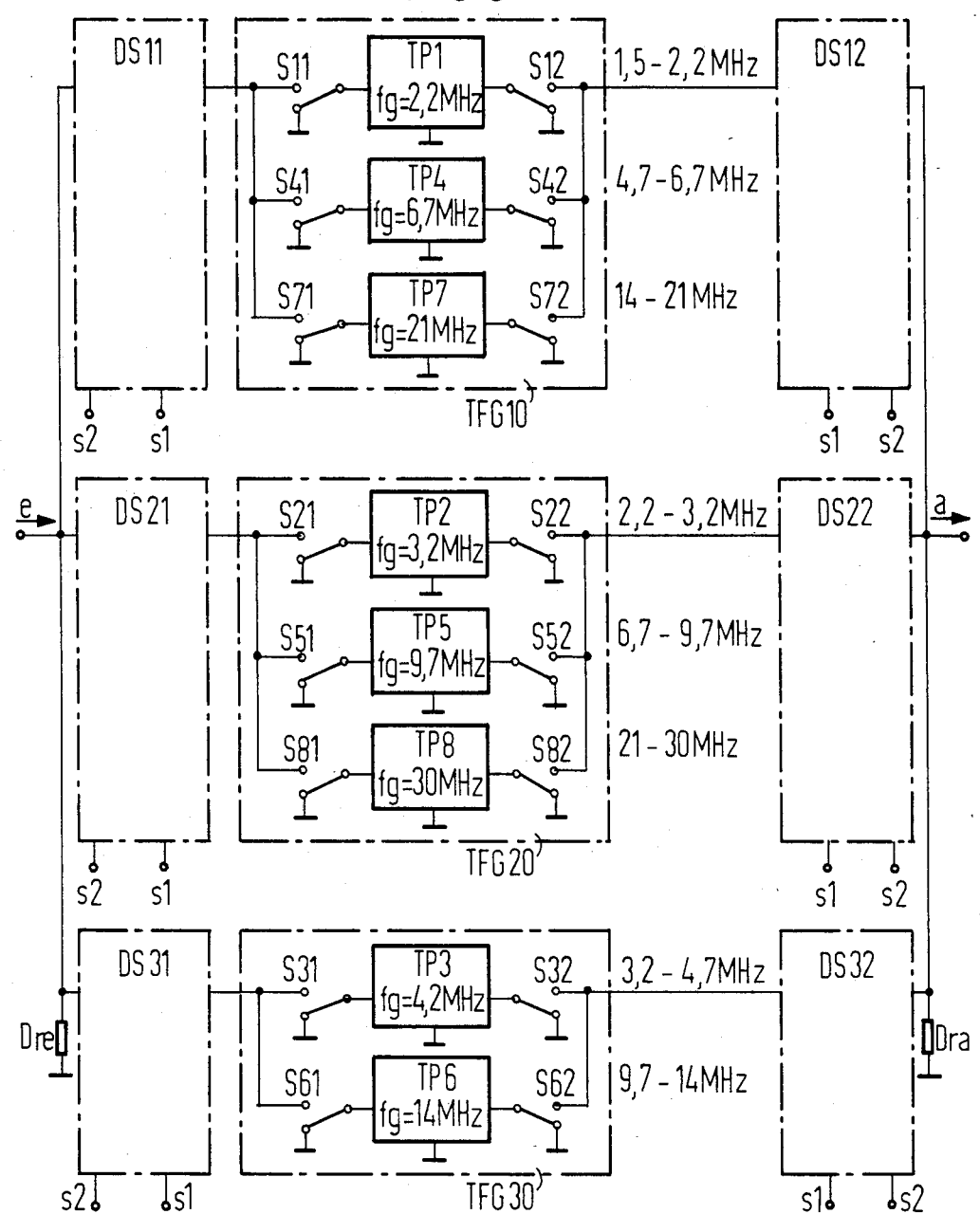
FIG. 3 is a schematic block diagram representing a filter arrangement sub-divided into three sub-filter groups, with electronic power switches which can be switched over between the sub-filter groups.

In FIG. 2 the filter arrangement of FIG. 1 has been sub-divided into two subsidiary filter groups TFG1 and TFG2. Here, the sub-filter group TFG1 contains the sub-filters TP1, TP3, TP5 and TP7, including their input-end and output-end electrically-controlled switches. The other sub-filters TP2, TP4, TP6 and TP8, including their input-end and output-end electrically-controlled switches, are assigned to the sub-filter group TFG2. The two sub-filter groups TFG1 and TFG2 each represent a transmission path between which it is possible to switch over very rapidly via diode switches DS11, DS21 and DS12, DS22, which are assigned to these sub-filter groups TFG1 and TFG2 at the input end and at the output end. Each of the diode switches DS11, DS21, DS12 and DS22 consist of a series arm and a shunt arm. The series arm contains a PIN diode D1 in series with a coupling capacitor C1 and the shunt arm contains a PIN diode D2 in series with a coupling capacitor C2. The switching currents required to switch the PIN diodes D1 and D2 are fed in via the terminals s1 and s2 and via the respective high-frequency chokes Dr1 and Dr2 to the connection points between the PIN diodes and the coupling capacitors assigned thereto. Also, for this purpose, the input e and the output a are each connected, with respect to direct current, to a reference potential via a respective high-frequency choke Dre and Dra.

The sub-filters are split into the two sub-filter groups TFG1 and TFG2 in such a manner that, independently of the position of the frequency jump interval within the overall frequency range to which the transmitter can be tuned, this frequency jump interval is always covered by a maximum of two sub-filters, of which one is assigned to the sub-filter group TFG1 and one is assigned to the sub-filter group TFG2.

Then, by switching on the sub-filters via their input-end and output-end relay switches, depending upon the position of the jump frequency, via the diode switches, the sub-filter in question can be rapidly and non-abrasively switched into the signal path between the input e and the output a.

The sub-division of the filter arrangement FA in FIG. 1 into two sub-filter groups TFG1 and TFG2 as shown in FIG. 2 results in a frequency jump interval of less than 2 MHz at the lower frequency limit of the overall frequency range to which the transmitter can be tuned. In accordance with the increasing frequency ranges of the sub-octave filters, with an increasing upper cut-off frequency, at a higher frequency position the jump frequency interval can then be selected to be correspondingly wider. If, independently of the frequency position of the frequency jump interval, a frequency jump interval having a minimum of 2.5 MHz if now required, the same can be achieved in accordance with FIG. 3 by sub-dividing the sub-filters of the filter arrangement FA as shown in FIG. 1 into three sub-filter groups TFG10, TFG20 and TFG30. The number of diode switches required for this purpose at the input end (DS11, DS21 and DS31) and at the output end (DS12, DS22 and DS32) therefore increases by two diode switches in comparison to the embodiment illustrated in FIG. 2.

Figure 4:
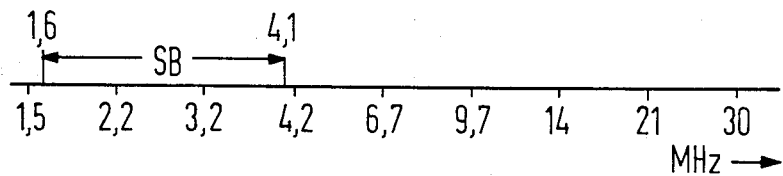
FIG. 4 is a frequency diagram which explains in detail the mode of operation of the filter arrangement illustrated in FIG. 3.

In the frequency diagram of FIG. 4, in which the overall frequency range of 1.5 MHz to 30 MHz to which the transmitter can be tuned has been plotted, it has been assumed that the frequency jump interval SB, which has a bandwidth of 2.5 MHz, has a lower frequency limit of 1.6 MHz and an upper frequency limit of 4.1 MHz. To permit jump operation to take place with a simultaneous suppression of undesired harmonics of the transmitter frequency, in the sub-filter group TFG10 the sub-filter TP1 must be connected via its switches S11 and S12, in the sub-filter group TFG20 the sub-filter TP2 must be connected via its switches S21 and S22, and in the sub-filter group TFG30 the sub-filter TP3 must be connected via its switches S31 and S32, in each case to the input and output of the sub-filter group to which they belong. The six diode switches can then serve to carry out a rapid and non-abrasive switch-over between the three transmission paths, formed in this manner, in accordance with the instantaneous position of the transmitter frequency within the jump frequency interval SB.

Radio transmitters which are capable of carrying out frequency jump operation and which are equipped with output-end harmonic filters are suitable for tactical use both in stationary and mobile operation.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a transmitter which can be tuned within a wide frequency band, in particular a short-wave transmitter, and being of the type comprising a transmitter end stage output, a transmitter output and a filter arrangement connected between the transmitter end stage output and the transmitter output, and in which the filter arrangement comprises sub-filters each assigned to a specific sub-frequency range of the wide frequency band, and in which the sub-filters can be selectively switched into the signal path via respective input and output relays connected in series therewith in dependence on the transmitter operating frequency in order to suppress undesired harmonics of the transmitter operating frequencies for frequency jump operation the improvement wherein:

the sub-filters and their respective input and output relays are divided into at least two groups in which the input relays of each group are connected to a common input terminal and the output relays of each group are connected to a common output terminal, the division into groups being such that, independently of the selected position of the sub-frequency range as a jump frequency interval, the jump frequency interval always occurs within a sub-frequency range that requires connection of a sub-filter from each group into the signal path if the jump traverses more than the frequency range of one sub-filter; and a plurality of input electronic switches connecting respective ones of said common input terminals to the transmitter end stage output and a plurality of output electronic switches connecting respective ones of said common output terminals to the transmitter output, each of said input and output electronic switches including control inputs for receiving operating control signals.

2. The improved transmitter of claim 1, wherein: the number of groups is two.

3. The improved transmitter of claim 2, wherein:
said sub-filters are sub-octave filters which, in an increasing ordinal number of correspondingly increasing frequencies of the adjacent sub-frequency ranges they represent, are alternately assigned to the two sub-filter groups.

4. The improved transmitter of claim 1, wherein: the number of groups is three.

5. The improved transmitter of claim 4, wherein:
the sub-filters comprise eight sub-octave filters of which, commencing from an increasing ordinal number of correspondingly increasing frequencies of the adjacent sub-frequency ranges, the first, fourth and seventh sub-filters form a first group, the second, fifth and eighth sub-filters form a second group, and the third and sixth sub-filters form a third group.

6. The improved transmitter of claim 1, wherein:
each of said electronic input and output switches comprises a series arm and a shunt arm, and each of said arms comprises a PIN diode.

7. The improved transmitter of claim 1, wherein:
each of said input electronic switches comprises a first PIN diode connected to said transmitter end stage output, a first capacitor connected in series with said first PIN diode and therewith forming a first junction, said first capacitor connected to said common input terminal of the respective group, a second capacitor connected to said first junction, a second PIN diode connected between said second capacitor and a reference potential and forming a second junction with said second capacitor, and wherein said control inputs include first and second control inputs for receiving said control signals connected to said first and second junctions, respectively.

8. The improved transmitter of claim 7, wherein:
each of said input electronic switches further comprises first and second high-frequency chokes respectively connected in series between said first and second control inputs and said first and second junctions.

9. The improved transmitter of claim 1, wherein:
each of said input electronic switches comprises a first PIN diode connected to said transmitter end stage output, a first capacitor connected in series with said first PIN diode and therewith forming a first junction, said first capacitor connected to said common input terminal of the respective group, a second capacitor connected to said first junction, a second PIN diode connected between said second capacitor and a reference potential and forming a second junction with said second capacitor, and wherein said control inputs include first and second control inputs for receiving said control signals connected to said first and second junctions, respectively.

10. The improved transmitter of claim 9, wherein:
each of said input electronic switches and each of said output electronic switches further comprises first and second high-frequency chokes respectively connected in series between said first and second control inputs and said first and second junctions.

11. The improved transmitter of claim 1, wherein:
each of said output electronic switches comprises a first PIN diode connected to said transmitter output, a first capacitor connected in series with said first PIN diode and therewith forming a first junction, said first capacitor connected to said common output terminal of the respective group, a second capacitor connected to said first junction, a second PIN diode connected between said second capacitor and a reference potential and forming a second junction with said second capacitor, and wherein said control inputs include first and second control inputs for receiving said control signals connected to said first and second junctions, respectively.

* * * * *